US010193000B1

(12) United States Patent
Wisotzki

(10) Patent No.: US 10,193,000 B1
(45) Date of Patent: Jan. 29, 2019

(54) FAST RECOVERY INVERSE DIODE

(71) Applicant: IXYS, LLC, Milpitas, CA (US)

(72) Inventor: Elmar Wisotzki, Darmstadt (DE)

(73) Assignee: IXYS, LLC, Milpitas, CA (US)

( * ) Notice: Subject to any disclaimer, the term of this patent is extended or adjusted under 35 U.S.C. 154(b) by 0 days.

(21) Appl. No.: 15/665,415

(22) Filed: Jul. 31, 2017

(51) Int. Cl.
| | |
|---|---|
| H01L 29/861 | (2006.01) |
| H01L 29/36 | (2006.01) |
| H01L 29/06 | (2006.01) |
| H01L 23/31 | (2006.01) |
| H01L 29/66 | (2006.01) |
| H01L 21/265 | (2006.01) |
| H01L 29/167 | (2006.01) |
| H01L 29/45 | (2006.01) |
| H01L 21/78 | (2006.01) |
| H01L 23/29 | (2006.01) |

(52) U.S. Cl.
CPC ...... *H01L 29/861* (2013.01); *H01L 21/26513* (2013.01); *H01L 21/78* (2013.01); *H01L 23/3171* (2013.01); *H01L 29/0615* (2013.01); *H01L 29/0646* (2013.01); *H01L 29/0684* (2013.01); *H01L 29/167* (2013.01); *H01L 29/36* (2013.01); *H01L 29/456* (2013.01); *H01L 29/66136* (2013.01); *H01L 23/291* (2013.01); *H01L 23/293* (2013.01)

(58) Field of Classification Search
None
See application file for complete search history.

(56) References Cited

U.S. PATENT DOCUMENTS

| 4,351,677 A | 9/1982 | Mochizuki et al. .......... 148/188 |
| 5,698,454 A | 12/1997 | Zommer ........................ 437/6 |

(Continued)

FOREIGN PATENT DOCUMENTS

| DE | 4337329 A1 | 5/1995 |
| EP | 0361316 A2 | 4/1990 |

(Continued)

OTHER PUBLICATIONS

Biermann et al., "New 3300V High Power Emcon-HDR Diode with High Dynamic Robustness," eupec GmbH and Infineon Technologies, Warstein, Germany 2009 (5 pages).

(Continued)

*Primary Examiner* — Eduardo A Rodela
*Assistant Examiner* — Nilufa Rahim

(57) ABSTRACT

An inverse diode die has a high reverse breakdown voltage, a short reverse recovery time $T_{rr}$, and is rugged in terms of reverse breakdown voltage stability over long term use in hard commutation applications. The die has an unusually lightly doped bottomside P type anode region and also has an N− type drift region above it. Both regions are of bulk wafer material. An N+ type contact region extends down into the drift region. A topside metal electrode is on the contact region. A P type silicon peripheral sidewall region laterally rings around the drift region. A topside passivation layer rings around the topside electrode. A bottomside metal electrode is on the bottom of the die. The die has a deep layer of hydrogen ions that extends through the N− drift region. The die also has a shallow layer of ions. Both ion layers are implanted from the bottomside.

26 Claims, 3 Drawing Sheets

FAST RECOVERY INVERSE DIODE

(56) References Cited

U.S. PATENT DOCUMENTS

| | | | |
|---|---|---|---|
| 6,507,050 B1 | 1/2003 | Green | 257/170 |
| 6,936,908 B2 | 8/2005 | Kelberlau et al. | 257/502 |
| 7,030,426 B2 | 4/2006 | Neidig | 257/170 |
| 7,442,630 B2 | 10/2008 | Kelberlau et al. | 438/510 |
| 8,093,652 B2 | 1/2012 | Veeramma et al. | 257/329 |
| 8,716,745 B2 | 5/2014 | Veeramma | 257/109 |
| 9,590,033 B1 | 3/2017 | Wisotzki et al. | H01L 29/646 |
| 2005/0116249 A1* | 6/2005 | Mauder | H01L 21/263 257/109 |
| 2013/0037906 A1* | 2/2013 | Hirler | H01L 21/761 257/506 |
| 2014/0117406 A1* | 5/2014 | Kakefu | H01L 21/263 257/139 |
| 2015/0054025 A1* | 2/2015 | Lu | H01L 29/32 257/139 |
| 2015/0371858 A1* | 12/2015 | Laven | H01L 21/263 438/530 |
| 2017/0317075 A1* | 11/2017 | Arai | H01L 27/0814 |

FOREIGN PATENT DOCUMENTS

| | | | |
|---|---|---|---|
| EP | 0361320 | 4/1990 | |
| EP | 0364760 | 4/1990 | |
| EP | 2320451 A1 | 5/2011 | |
| JP | 09162136 A * | 6/1997 | H01L 21/265 |

OTHER PUBLICATIONS

Data sheet for DWN 17-18 Diode Chip, IXYS Corporation Dec. 15, 2015 (2 pages).

Lutz et al., "Semiconductor Power Devices—Physics, Characteristics, Reliability," Springer-Verlag Berlin Heidelberg 2011, ISBN 978-3-642-11124-2, Library of Congress Control No. 2010934110, pp. 146-147 (5 pages).

Data Sheet entitled, "FRED, Rectifier Diode and Thyristor Chips in Planar Design," IXYS Corporation 2004 (5 pages).

Humbel, O., et al., "4.5 W-Fast-Diodes with Expanded SOA Using a Multi-Energy Proton Lifetime Control Technique", 11th International Symposium on Power Semiconductor Devices and ICs. (May 1999) [retrieved on Dec. 18, 2018]. Retrieved from Internet URL: https://ieeexplore.ieee.org/ielx5/6175/16497/00764078.pdf?tp=&arnumber=764078&isnumber=16497.

* cited by examiner

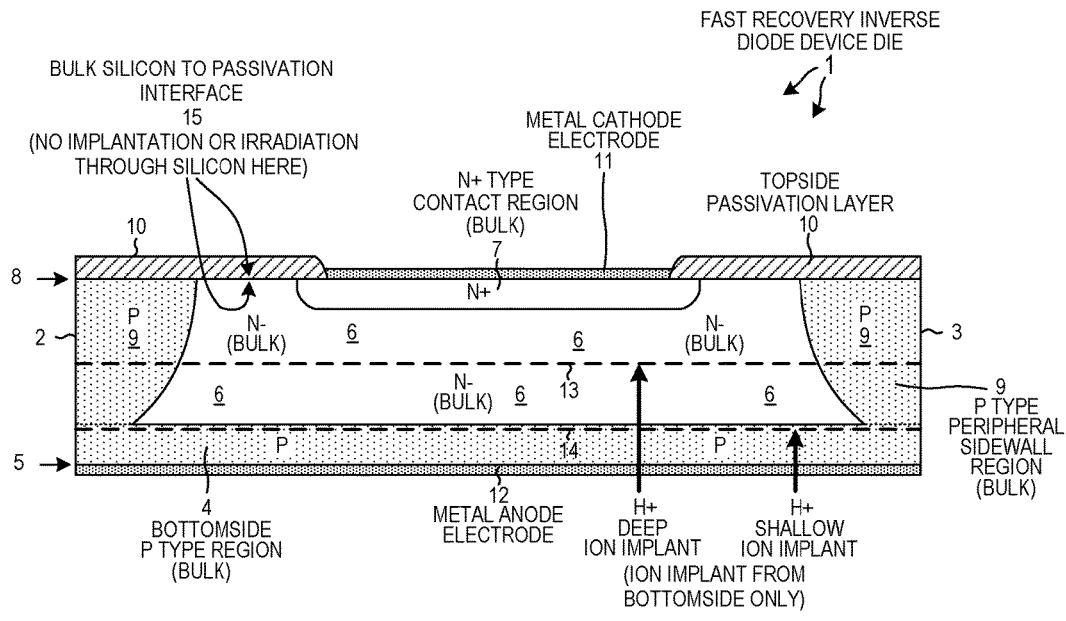

FAST RECOVERY INVERSE DIODE

FIG. 1

| REGION | CONCENTRATION OR DOSE | DOPANT OR MATERIAL | THICKNESS OR DEPTH |
|---|---|---|---|
| BOTTOMSIDE P TYPE REGION | 1E17 - 8E17 atoms/cm$^3$ | BORON | 40 microns thick |
| N- TYPE DRIFT REGION | 1E14 - 1E15 atoms/cm$^3$ | PHOSPHORUS | 180 microns thick |
| N+ CATHODE CONTACT REGION | 1E19 atoms/cm$^3$ | PHOSPHORUS | 20 microns thick |
| P TYPE PERIPHERAL SIDEWALL REGION | 1E18 - 5E19 atoms/cm$^3$ | ALUMINUM | 220 microns deep 145 microns wide at top |
| METAL CATHODE ELECTRODE | | ALUMINUM | 7 microns thick |
| METAL ANODE ELECTRODE | | Ti-Ni-Ag | 1 micron thick |
| TOPSIDE PASSIVATION LAYER | | SILICON NITRIDE AND/ OR POLYIMIDE | 15 microns thick |
| SHALLOW ION IMPLANT | DOSE = 2 x 10$^{12}$ ions/cm$^2$ | HYDROGEN ION (H+) | IMPLANT DEPTH = 35 microns |
| DEEP ION IMPLANT | DOSE = 2 x 10$^{12}$ ions/cm$^2$ | HYDROGEN ION (H+) | IMPLANT DEPTH = 110 microns |

FAST RECOVERY INVERSE DIODE
(REVERSE BREAKDOWN VOLTAGE = 1800 VOLTS)

FIG. 2

ALTERNATIVE P TYPE ISOLATION STRUCTURE

FAST RECOVERY INVERSE DIODE

TECHNICAL FIELD

The described embodiments relate to inverse diode devices and to related methods.

BACKGROUND INFORMATION

Most all types of commercially-available power diodes having high reverse breakdown voltage capabilities have N-type bottomside cathodes. A rare exception is the so-called "inverse diode" or "reverse diode" that is commercially available from IXYS Corporation, 1590 Buckeye Drive, Milpitas, Calif. These unusual diodes have P type isolation structures involving a bottomside P type anode region as well as P type peripheral sidewall diffusion regions. Not only do these diodes have very high reverse breakdown voltages, but they also typically exhibit superior dynamic robustness. An attempt was made to extend this "inverse diode" technology to so-called "fast diodes" having lower reverse recovery times. The reverse recovery time of a diode is denoted $T_{rr}$ in the literature and in data sheets. As set forth in U.S. Pat. No. 8,716,745, an N− type epitaxial silicon layer was grown on a P type wafer. The resulting inverse diode was simulated to have superior stability and a high reverse breakdown voltage while at the same time having a thinner N− type layer as compared to a conventional diode having the same reverse breakdown capabilities. For additional information on inverse diode structures and on P type isolation structures, see: 1) U.S. Pat. No. 7,442,630, entitled "Method For Fabricating Forward And Reverse Blocking Devices", filed Aug. 30, 2005, by Kelberlau et al.; 2) U.S. Pat. No. 5,698,454, entitled "Method Of Making A Reverse Blocking IGBT", filed Jul. 31, 1995, by N. Zommer; 3) J. Lutz et al., "Semiconductor Power Devices", pages 146-147, published by Springer, Berlin and Heidelberg (2011); 4) the data sheet entitled "Diode Chip", DWN 17-18, by IXYS Corporation of Milpitas, Calif. 95035, USA; 5) U.S. Pat. No. 9,590,033, entitled "Trench Separation Diffusion For High Voltage Device", filed Nov. 20, 2005, by Wisotzki et al.; 6) U.S. Pat. No. 4,351,677, entitled "Method of Manufacturing Semiconductor Device Having Aluminum Diffused Semiconductor Substrate", filed Jul. 10, 1980, by Mochizuki et al.; 7) U.S. Pat. No. 6,507,050, entitled "Thyristors Having A Novel Arrangement of Concentric Perimeter Zones", filed Aug. 16, 2000, by Green; 8) U.S. Pat. No. 6,936,908, entitled "Forward and Reverse Blocking Devices", filed Mar. 13, 2002, by Kelberlau et al.; 9) U.S. Pat. No. 7,030,426, entitled "Power Semiconductor Component in the Planar Technique", filed Mar. 14, 2005, by Neidig; 10) U.S. Pat. No. 8,093,652, entitled "Breakdown Voltage For Power Devices", filed Aug. 27, 2003, by Veeramma et al.; 11) the 2004 description entitled "FRED, Rectifier Diode and Thyristor Chips in Planar Design", by IXYS Semiconductor GmbH, Edisonstrasse 15, D-68623, Lampertheim, Germany.

SUMMARY

An inverse diode die has a high reverse breakdown voltage, has a small reverse recovery time $T_{rr}$ when recovering from high reverse voltages close to this breakdown voltage, and also is rugged in terms of reverse breakdown voltage stability over long term use in hard commutation applications. The inverse diode die has a bottomside P type anode region of bulk silicon wafer material, and also has an N− type drift region above it of bulk silicon wafer material. There is no epitaxial silicon in the structure. The P type dopant concentration of the bottomside P type anode region is relatively light for an inverse diode. The P type dopant concentration is less than $8 \times 10^{17}$ atoms/cm$^3$. An N+ type silicon contact region extends downward from the top semiconductor surface of the die and into the N− type drift region. A P type silicon peripheral sidewall region extends laterally inwardly from the four peripheral side edges of the die. This P type silicon peripheral sidewall region laterally rings the N− type drift region so that the P type silicon peripheral sidewall region joins the bottomside P type silicon region. The P type silicon peripheral side region is deep and extends all the way from the topside semiconductor surface down to the top of the bottomside P type anode region. The four peripheral side edges of the die are entirely P type silicon. Together the P type silicon peripheral sidewall region and the bottomside P type silicon region form a P type isolation structure. The P type dopant of the P type silicon peripheral sidewall region can be aluminum or boron.

A topside passivation layer is disposed on a part of the top semiconductor surface of the die so that this topside passivation layer rings around the central N+ type silicon contact region. This passivation is disposed on bulk wafer material and not on epitaxial silicon. A metal cathode electrode is disposed on the top of the N+ type silicon contact region on the topside of the die, and a metal anode electrode is disposed on the bottom of the bottomside P type anode region on the bottomside of the die.

The inverse diode also has a deep layer of hydrogen ions. This deep layer of hydrogen ions has a distribution about a hydrogen ion local concentration peak surface. The hydrogen ion local concentration peak surface is a planar surface that extends in a plane parallel to the plane of the bottom semiconductor surface. The hydrogen ion local concentration peak surface extends through the N− type silicon region but does not extend through the bottomside P type silicon region. In one embodiment, the hydrogen ion local concentration peak surface is disposed about halfway between the top of the bottomside P type anode region and the bottom of the N+ type contact region. In addition, the inverse diode also has a shallow layer of implanted ions. The ions of this shallow layer may be hydrogen ions or helium ions. This shallow layer of ions has a distribution about an ion local concentration peak surface. The ion local concentration peak surface is a planar surface that extends in a plane parallel to the plane of the bottom semiconductor surface of the die. The ion local concentration peak surface extends through the bottomside P type silicon region but does not extend through the N− type silicon region. During manufacture of the inverse diode, there is no ion implantation through the top semiconductor surface of the die.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIG. 1 is a cross-sectional side view diagram of a fast recovery inverse diode device die 1 in accordance with one novel aspect.

FIG. 2 is a table sets forth various details and characteristics about the various parts of the fast recovery inverse diode device 1 of FIG. 1.

DETAILED DESCRIPTION

Figure 3:
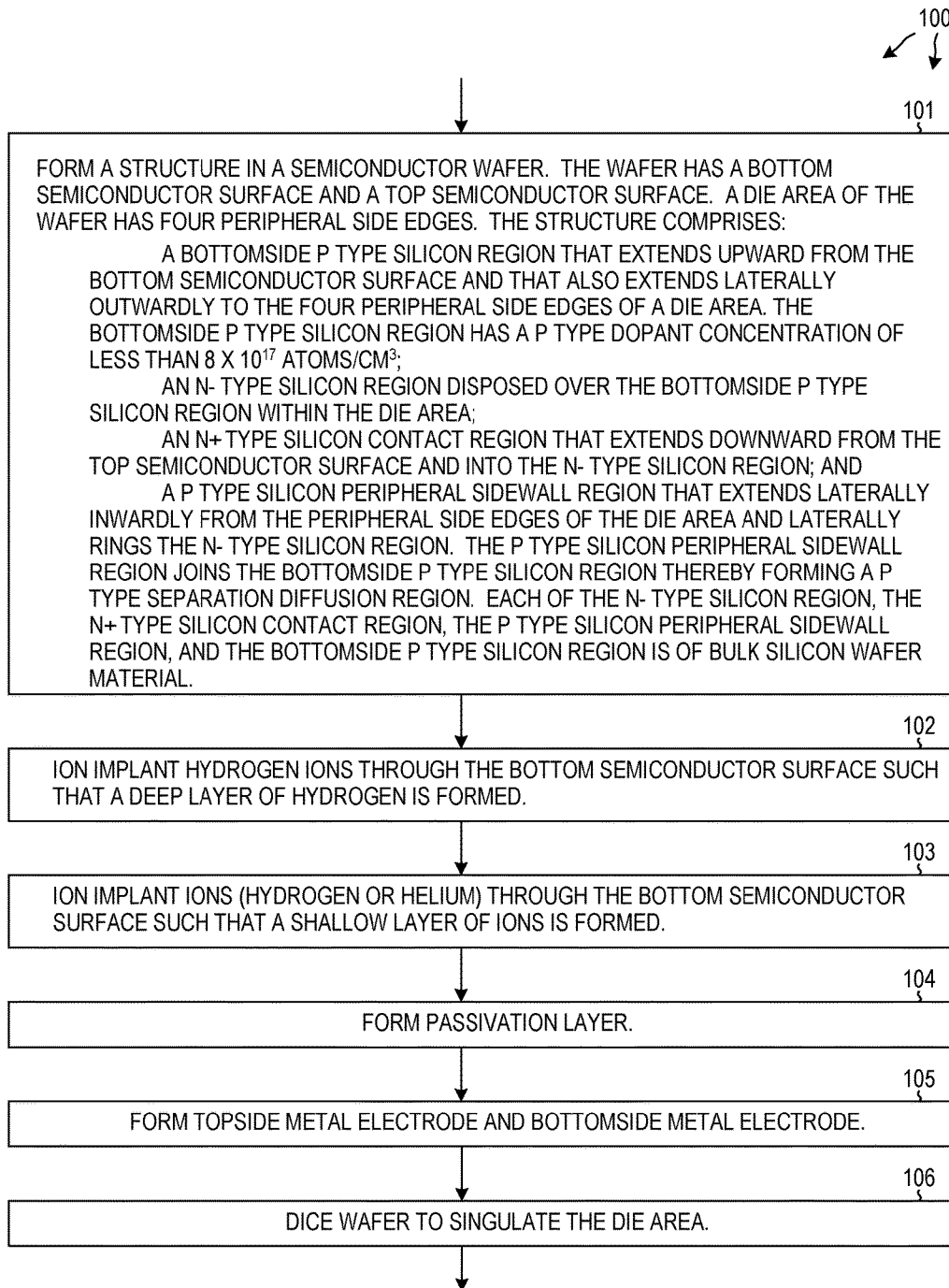
FIG. 3 is a flowchart of a manufacturing method 100 in accordance with one novel aspect.

Reference will now be made in detail to background examples and some embodiments of the invention, examples of which are illustrated in the accompanying drawings. In the description and claims below, when a first object is referred to as being disposed "over" or "on" a second object, it is to be understood that the first object can be directly on the second object, or an intervening object may be present between the first and second objects. Similarly, terms such as "top", "topside", "up", "upward", "down", "downward", "vertically", "laterally", "side", "under", "bottom" and "bottomside" are used herein to describe relative orientations between different parts of the structure being described, and it is to be understood that the overall structure being described can actually be oriented in any way in three-dimensional space. When processing is described in the description below as being performed on the bottom of the wafer, such as for example when dopants are said to diffuse upward, it is understood the wafer may actually be oriented upside down during these processing steps, and may be processed from the top in ordinary fashion.

FIG. 1 is a cross-sectional side view diagram of a fast recovery inverse diode device die 1 in accordance with one novel aspect. The die 1 is a discrete diode device. The die 1 has a rectangular top surface, a rectangular bottom surface, and four peripheral side edges. Two of the side edges 2 and 3 are illustrated in the cross-sectional side view diagram. More particularly, a bottomside P type silicon region 4 extends upward from the bottom semiconductor surface 5 of the die and also extends laterally outwardly to the peripheral side edges 2 and 3 of the die. The bottomside P type silicon region 4 has a relatively low P type dopant concentration of less than $8\times10^{17}$ atoms/cm$^3$. This is a low P type dopant concentration for the anode of an inverse diode.

An N– type silicon region 6 is disposed over the bottomside P type silicon region 4 as shown in FIG. 1. This N– type silicon region 6, which is also referred to as the N– drift region, is the cathode of the inverse diode because the principal PN junction of the inverse diode is the junction between the top of the bottomside P type silicon region 4 and the bottom of the N– type silicon region 6. An N+ type silicon contact region 7 extends from the top semiconductor surface 8 down into the N– type silicon region 6.

The die also has a P type silicon peripheral sidewall region 9 that extends laterally inwardly from the four peripheral side edges of the die such that it rings around the central N– type silicon region 6. The P type silicon peripheral sidewall region 9 joins the bottomside P type silicon region 4 and also extends up to the top semiconductor surface 8. The combination of the P type peripheral region 9 and the P type bottomside region 4 form what is called the "P type isolation structure" (also sometimes called the "P type isolation region", or the "P type separation diffusion structure", or the "P type separation diffusion region"). P type silicon of this structure fully surrounds the N– drift silicon region 6 both peripherally from the sides as well as underneath from the bottom.

The bottomside P type silicon region 4 is said to extend outwardly to the peripheral side edges of the die even though it is understood that the bottomside P type silicon region 4 and the P type silicon peripheral sidewall region 9 merge here. The bottomside P type silicon region 4 is said to have a P type dopant concentration of less than $8\times10^{17}$ atoms/cm$^3$ even though the P type dopant concentration may be higher at the peripheral parts of region 9 due to mixing with dopants from the P type silicon peripheral sidewall region 9. This $8\times10^{17}$ atoms/cm$^3$ concentration is measured in a volume of silicon that is close to the bottom semiconductor surface 5 in the central portion of the region 4 directly under the cathode electrode 11.

Importantly, there is no epitaxial silicon in the structure of FIG. 1. Importantly, all of the regions 4, 6, 7, and 9 are bulk silicon material and are regions of the same silicon wafer.

A topside passivation layer 10 is disposed on a part of the top semiconductor surface 8 as shown. The topside passivation layer 10 covers the top surface of the P type silicon peripheral sidewall region 9 and rings around the N+ type silicon contact region 7 as shown. Reference numeral 15 in FIG. 1 identifies the silicon/passivation interface. A topside metal electrode 11 is disposed on the N+ type silicon contract region 7. This topside electrode 11 is a cathode electrode or a cathode terminal of the diode device. A bottomside metal electrode 12 is disposed on the bottom semiconductor surface 5 of the die. This bottomside metal electrode 12 extends all across the bottom semiconductor surface 5 from the die edge 2 to the die edge 3. Bottomside metal electrode 12 as well as the bottomside P type region 4 are much wider than the topside metal electrode 11 and the N+ type contact region 7. Bottomside metal electrode 12 is an anode electrode or an anode terminal of the diode device.

In addition, the die 1 includes a deep layer of hydrogen ions. This deep layer has a distribution in the vertical dimension about a hydrogen ion local concentration peak surface 13. This hydrogen ion local concentration peak surface 13 is disposed in a plane. This plane is parallel to the plane of the bottom semiconductor surface 5. The hydrogen ion local concentration peak surface 13 extends through the N– type silicon region 6 but does not extend through any part of the bottomside P type silicon region 4. The horizontal plane of this hydrogen ion local concentration peak surface 13 is disposed about midway between the top of the bottomside P type silicon region 4 and the bottom of the N+ type silicon contact region 7. In the example of FIG. 1, this is a depth (measured from the bottom semiconductor surface) of about 110 microns.

In addition, the die 1 includes a shallow layer of ions. These ions can, for example, be either hydrogen ions (protons) or helium ions. In the present example, they are hydrogen ions. This shallow layer of ions has a distribution in the vertical dimension about an ion local concentration peak surface 14. This ion local concentration peak surface 14 is disposed in a plane. This plane is parallel to the plane of the bottom semiconductor surface 5. The ion local concentration peak surface 14 extends through the bottomside P type silicon region 4 but does not extend through any part of the N– type silicon region 6. In the example of FIG. 1, the ion local concentration peak surface 14 is at a depth (measured from the bottom semiconductor surface) of about 35 microns.

Importantly, bulk silicon of the diode device is not irradiated with high energy electrons of the kind used to create recombination centers in silicon. Also, there is no ion implantation (hydrogen or helium) through the bulk silicon to passivation layer interface 15. There is no ion implantation from the topside. The implantation of hydrogen ions occurs from the bottomside of the structure only. Although the diode 500 of FIG. 5 of U.S. Pat. No. 8,716,745 was simulated to have good stability, in actual practice the device proved not to be as rugged in terms of breakdown voltage stability as desired. Initially the device did have a high reverse breakdown voltage capability. As devices of this type were used over time, however, some of the devices exhibited decreasing reverse breakdown voltage capability. This degradation of performance is believed to be due, at least in part, to the quality of the interface between the silicon at the top of epitaxial silicon and the passivation layer. Moreover, if high energy electron irradiation were employed in order to create recombination centers in order to reduce charge carrier lifetimes in the vicinity of the PN junction, then the silicon/passivation interface could be further damaged. High energy electrons introduced during an electron irradiation process pass all the way through the wafer. The wafer cannot be irradiated by electrons in this way to cause just local recombination centers without others of the electrons causing damage to other parts of the structure such as at the silicon/passivation interface. In accordance with one novel aspect, the diode device die 1 of FIG. 1 has no epitaxial silicon, has no epitaxial silicon to passivation interface, is not subjected to electron irradiation, and is not subjected to ion implantation (such as hydrogen ion implantation, or helium ion implantation) from the topside.

The intended purpose of the deep ion implant is to create recombination centers and charge carrier traps in the silicon, thereby reducing the lifetime of charge carriers. Majority charge carrier lifetime in the N− type silicon region 6 in the area of the deep hydrogen implant is less than three microseconds.

The intended purpose of the shallow ion implant is to reduce charge carrier injection efficiency from the bottomside P type silicon region 4 up into the N− type silicon region 6. Charge carrier injection efficiency of the P type silicon region 4 is also reduced somewhat by using a somewhat uncommonly lightly doped P type anode. The P type dopant concentration of the bottomside P type silicon region 4 is less than $8 \times 10^{17}$ atoms/cm$^3$. Majority charge carrier injection efficiency of the P type silicon region 4 into the N− type silicon region 6 is therefore reduced somewhat as compared to a conventional inverse diode. The starting material of this region 4 is an N− type wafer of non-crystalline wafer substrate material. The bottomside P type silicon region 4 is formed by doping from the bottom of this wafer. Accordingly, the bottomside P type silicon region 4 also has a background concentration of N type dopants of about $1 \times 10^{15}$ atoms/cm$^3$. Heavy metals such as gold or platinum are not present and are not used in the structure of FIG. 1 as carrier lifetime killers. The attendant increase in forward voltage drop due to such heavy metal atoms is therefore not suffered. When the fast recovery inverse diode of FIG. 1 is used in a high frequency switching application, and when the diode commutates from operating in the forward voltage condition to a reverse blocking condition, there is a time when the depletion region at the PN junction increases in size. In order for the diode to begin blocking current flow in its reverse voltage condition, the so-called diode recovery charge (due to the expansion of the depletion region in the high reverse voltage situation) must be removed. It can only be removed by recombination of electrons and holes or by a flow of reverse recovery current $I_r$. A large magnitude reverse recovery current $I_r$ is undesired. The maximum of the reverse recovery current is denoted $I_{rr}$. Also, the maximum rate of change of this reverse recovery current, as it decays, should not be too great. The shallow and deep ion implantations serve to reduce the magnitude of charge (that must be removed from the diode to start blocking) as well as to smooth the surge of reverse recovery current so that its maximum rate of change is smaller. As a result, the reverse recovery time $T_{rr}$ is smaller.

The inverse diode device of FIG. 1 has a very high reverse breakdown voltage of at least 1800 volts. When commutating from a forward voltage condition to a reverse voltage condition of about 900 volts, the reverse recovery time $T_{rr}$ of the diode is approximately 200 nanoseconds. The diode of FIG. 1 is therefore said to be a "fast diode" or a "fast recovery diode". This is achieved without degrading the ruggedness of the device in terms of maintaining its high reverse breakdown voltage capability over time as the diode device is used. The diode of FIG. 1 maintains its 1800 volt reverse breakdown voltage even when it is subjected to an HTRB test under a high reverse voltage condition for 1000 hours at 150 degrees Celsius. The 1800 volt reverse breakdown voltage is therefore said to be "stable".

FIG. 2 is a table that sets forth various details and characteristics about the various parts of the fast recovery inverse diode device of FIG. 1. The H+ deep implant is performed using ion beam equipment. The implant dose is $2 \times 10^{12}$ ions per cm$^2$. The implant depth is 110 microns. The implant dose is relatively low, so the temperature at the bottom silicon surface during implantation is advantageously low throughout the ion implant process. In one example, the shallow ion implant is also an H+ ion implantation. This implant is performed using the same equipment as is used in the H+ deep implant. The implant dose is $2 \times 10^{12}$ ions per cm$^2$. The implant depth is 35 microns.

Both ion implantation steps occur after topside passivation and after topside and bottomside metalization. After ion implantation, the wafers are diced, and tested, and packaged, and tested again.

FIG. 3 is a flowchart of a manufacturing method 100 in accordance with one novel aspect. A structure is formed (step 101) in a wafer. The wafer has a bottom semiconductor surface and a top semiconductor surface. A die area of the wafer has four peripheral side edges. The structure comprises a bottomside P type silicon region, an N− type silicon region, an N+ type silicon contact region, and a P type silicon peripheral sidewall region. These semiconductor regions within the die area appear as shown in FIG. 1. At this point in the manufacturing process, the wafer has not been diced, nor has it been passivated or metalized, but the structure within the die area has the structure illustrated in FIG. 1. Next, hydrogen ions are implanted (step 102) through the bottom semiconductor surface so as to form the deep layer of hydrogen ions described above in connection with FIG. 1. Next, ions (hydrogen or helium) are implanted (step 103) through the bottom semiconductor surface so as to form the shallow layer of ions described above in connection with FIG. 1. A passivation layer is formed (step 104) on the top semiconductor surface. A topside metal electrode and a bottomside metal electrode are formed (step 105). The wafer is then diced (step 106) such that the die area becomes an inverse diode device die. The inverse diode device die has the structure illustrated in FIG. 1. In the manufacturing method of 100, the deep ion implant can occur either before or after the shallow ion implant. The doped regions of the wafer can be formed before or after the ion implantation steps. Also, the passivation layer can be formed before or after the ion implantation steps. Also, the forming of the metal electrodes can occur either before or after the ion implantation steps. There is, however, no ion implantation through the silicon at the silicon/passivation interface 15, regardless of whether the ion implantation steps occur before or after the passivation step.

In another embodiment, an inverse diode die has a structure as described above in connection with FIG. 1 except that: 1) there is no shallow layer of ions, and 2) the P type dopant concentration of the bottomside P type silicon region 4 is even lighter at less than $1 \times 10^{16}$ atoms/cm$^3$. The deep layer of hydrogen ions is preferably implanted from the bottomside of the structure, but in another example it is implanted from the topside of the structure. The light $1 \times 10^{16}$ atoms/cm$^3$ doping of the P type silicon of region 4 makes region 4 a so-called "transparent emitter".

In another embodiment, an inverse diode die has a structure as described above in connection with FIG. 1 except that: 1) there is no shallow layer of ions, 2) there is no deep layer of hydrogen ions, 3) the P type dopant concentration of the bottomside P type silicon region 4 is even lighter at less than $1 \times 10^{16}$ atoms/cm$^3$, 4) the structure is irradiated with electrons. The electrons have high enough energy so that they create recombination sites in and throughout the N– type silicon of the region 6. The structure can either be irradiated from the topside, or from the bottomside.

In another embodiment, an inverse diode die has a structure as described above in connection with FIG. 1 except that: 1) there is no deep layer of hydrogen ions, and 2) the structure is irradiated with electrons. The electrons have high enough energy so that they create recombination sites in and throughout the N– type silicon of the region 6. The structure can either be irradiated from the topside, or from the bottomside.

Figure 4:
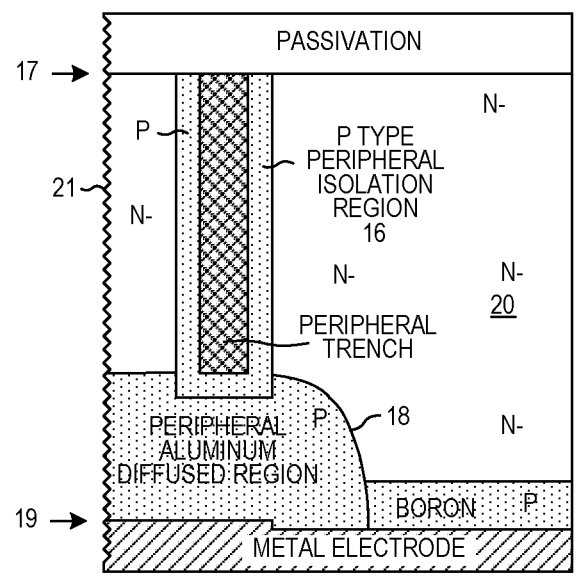
FIG. 4 is a cross-sectional side view diagram of an alternative P type isolation structure that can be used in a novel inverse diode rather than the P type isolation structure illustrated in FIG. 1.

Although certain specific embodiments are described above for instructional purposes, the teachings of this patent document have general applicability and are not limited to the specific embodiments described above. Although an example of an inverse diode die is set forth above that has a P type silicon peripheral sidewall region 9 that extends laterally all the way to the four peripheral side edges of the die, in other embodiments the P type silicon peripheral region need not extend all the way to the die side edges. In one example, the peripheral isolation structure set forth in U.S. Pat. No. 9,590,033, entitled "Trench Separation Diffusion For High Voltage Device", filed Nov. 20, 2015, by Wisotzki et al. is employed. FIG. 4 illustrates this structure. Reference numeral 21 identifies a side edge of the die. Even though some parts of the die side edges are of N– type silicon, the trench isolation structure has a P type peripheral isolation region 16 that extends all the way from the top semiconductor surface 17 down to a P type region 18 at the bottom semiconductor surface 19. Accordingly, peripheral P type silicon entirely laterally rings around the N– type central drift region 20. The entire subject matter of U.S. Pat. No. 9,590,033 is incorporated herein by reference. Accordingly, various modifications, adaptations, and combinations of various features of the described embodiments can be practiced without departing from the scope of the invention as set forth in the claims.

What is claimed is:

1. A power semiconductor device die having a top semiconductor surface, a bottom semiconductor surface, and peripheral side edges, the die comprising:
   a bottomside P type silicon region that extends upward from the bottom semiconductor surface of the die that also extends laterally outwardly to the peripheral side edges of the die, wherein the bottomside P type silicon region has a P type dopant concentration of less than $8 \times 10^{17}$ atoms/cm$^3$;
   an N– type silicon region disposed over the bottomside P type silicon region;
   an N+ type silicon contact region that extends downward from the top semiconductor surface and into the N– type silicon region;
   a P type silicon peripheral sidewall region that extends laterally inwardly from the peripheral side edges of the die and laterally rings the N– type silicon region, wherein the P type silicon peripheral sidewall region joins the bottomside P type silicon region thereby forming a P type isolation structure, and wherein each of the N– type silicon region, the N+ type silicon contact region, the P type silicon peripheral sidewall region, and the bottomside P type silicon region is of bulk silicon wafer material;
   a topside passivation layer disposed over a part of the top semiconductor surface of the die, wherein the topside passivation layer is disposed over the P type silicon peripheral sidewall region and rings around the N+ type silicon contact region;
   a deep layer of hydrogen ions that has a distribution disposed about a hydrogen ion local concentration peak surface, wherein the hydrogen ion local concentration peak surface is a planar surface that extends in a plane parallel to the bottom semiconductor surface, and wherein the hydrogen ion local concentration peak surface extends through the N– type silicon region but does not extend through the bottomside P type silicon region;
   a shallow layer of ions that has a distribution disposed about an ion local concentration peak surface, wherein the ion local concentration peak surface is a planar surface that extends in a plane parallel to the bottom semiconductor surface, wherein the ion local concentration peak surface extends through the bottomside P type silicon region but does not extend through the N– type silicon region, and wherein the ions of the shallow layer of ions are ions taken from the group consisting of hydrogen ions and helium ions;
   a topside metal electrode disposed on the N+ type silicon contact region; and
   a bottomside metal electrode disposed on the bottom semiconductor surface of the die.

2. The power semiconductor device die of claim 1, wherein the P type dopant concentration of the bottomside P type silicon region is less than $1 \times 10^{16}$ atoms/cm$^3$.

3. The power semiconductor device die of claim 1, wherein the power semiconductor device die is a discrete diode device that has a reverse breakdown voltage of at least 1800 volts.

4. The power semiconductor device die of claim 1, wherein the topside passivation layer is disposed directly on the part of the top semiconductor surface.

5. The power semiconductor device die of claim 1, wherein the topside passivation layer contacts the topside metal electrode.

6. The power semiconductor device die of claim 1, wherein the power semiconductor device die is part of a packaged power device having two terminals.

7. A method comprising:
   (a) forming a structure in a semiconductor wafer, wherein the wafer has a bottom semiconductor surface and a top semiconductor surface, wherein there is a die area of the semiconductor wafer, wherein the die area has four peripheral side edges, and wherein the structure comprises:
- a bottomside P type silicon region that extends upward from the bottom semiconductor surface and that also extends laterally outwardly to the four peripheral side edges of the die area, wherein the bottomside P type silicon region has a P type dopant concentration of less than $8 \times 10^{17}$ atoms/cm$^3$;
- an N− type silicon region disposed over the bottomside P type silicon region within the die area;
- an N+ type silicon contact region that extends downward from the top semiconductor surface and into the N− type silicon region; and
- a P type silicon peripheral sidewall region that laterally rings the N− type silicon region, wherein the P type silicon peripheral sidewall region and the bottomside P type silicon region together are parts of a P type isolation structure that extends from the top semiconductor surface to the bottom semiconductor surface, and wherein each of the N− type silicon region, the N+ type silicon contact region, the P type silicon peripheral sidewall region, and the bottomside P type silicon region is of bulk silicon wafer material;

(b) ion implanting hydrogen ions through the bottom semiconductor surface such that a deep layer of hydrogen ions is formed, wherein the deep layer of hydrogen ions has a distribution disposed about a hydrogen ion local concentration peak surface, and wherein the hydrogen ion local concentration peak surface extends through the N− type silicon region but does not extend through the bottomside P type silicon region;

(c) ion implanting ions through the bottom semiconductor surface such that a shallow layer of ions is formed, wherein the shallow layer of ions has a distribution disposed about an ion local concentration peak surface, wherein the ion local concentration peak surface is disposed between the deep layer of hydrogen ions and the bottom semiconductor surface, and wherein the ions of the shallow layer of ions are ions taken from the group consisting of hydrogen ions and helium ions;

(d) forming a topside passivation layer such that the topside passivation layer is disposed over a part of the top semiconductor surface;

(e) forming a topside metal electrode that contacts the N+ type silicon contact region; and (f) forming a bottomside metal electrode that contacts the bottomside P type silicon region.

8. The method of claim 7, wherein step (b) and step (c) occur after step (d).

9. The method of claim 7, wherein step (b) and step (c) occur before step (d).

10. The method of claim 7, wherein step (b) and step (c) occur after step (f).

11. The method of claim 7, wherein step (b) and step (c) occur before step (f).

12. The method of claim 7, wherein step (b) and step (c) occur after step (a).

13. The method of claim 7, wherein step (b) and step (c) occur before step (a).

14. The method of claim 7, wherein an amount of the top semiconductor surface is in contact with the passivation layer after the passivation layer has been formed in (d), and wherein no hydrogen ions and no helium ions are ion implanted through this amount of the top semiconductor surface.

15. The method of claim 7, wherein the die area has a single PN junction, and wherein the die area includes no semiconductor device other than a diode.

16. The method of claim 7, wherein the topside passivation layer is disposed directly on the part of the top semiconductor surface.

17. The method of claim 7, wherein no hydrogen ions and no helium ions are ion implanted through the top semiconductor surface.

18. The method of claim 7, wherein the topside passivation layer contacts the topside metal electrode.

19. An inverse diode die having a top semiconductor surface, a bottom semiconductor surface, and peripheral side edges, the die comprising:
- a bottomside P type silicon region that extends upward from the bottom semiconductor surface of the die that also extends laterally outwardly to the peripheral side edges of the die, wherein a central part of the bottomside P type silicon region has a P type dopant concentration of less than $8 \times 10^{17}$ atoms/cm$^3$;
- an N− type silicon region disposed over the central part of the bottomside P type silicon region;
- an N+ type silicon contact region that extends downward from the top semiconductor surface and into the N− type silicon region;
- a P type silicon peripheral isolation region that extends downward from the top semiconductor surface such that P type silicon extends all the way from the top semiconductor surface down to the bottom semiconductor surface, wherein the P type silicon that extends from the top semiconductor surface down to the bottom semiconductor surface forms a peripheral isolation structure that laterally rings around the N− type silicon region, and wherein each of the N− type silicon region, the N+ type silicon contact region, the P type silicon peripheral isolation region, and the bottomside P type silicon region is of bulk silicon wafer material;
- a topside passivation layer disposed over a part of the top semiconductor surface of the die, wherein the topside passivation layer rings around the N+ type silicon contact region;
- a deep layer of hydrogen ions that has a distribution disposed about a hydrogen ion local concentration peak surface, wherein the hydrogen ion local concentration peak surface extends through the N− type silicon region but does not extend through the bottomside P type silicon region;
- a shallow layer of ions that has a distribution disposed about an ion local concentration peak surface, wherein the ion local concentration peak surface is disposed between the deep layer of hydrogen ions and the bottom semiconductor surface, and wherein the ions of the shallow layer of ions are ions taken from the group consisting of hydrogen ions and helium ions;
- a topside metal electrode disposed on the N+ type silicon contact region; and
- a bottomside metal electrode disposed on the bottom semiconductor surface of the die.

20. The inverse diode die of claim 19, wherein some silicon of the peripheral side edges of the die is N type silicon.

21. The inverse diode die of claim 19, wherein no silicon of the peripheral side edges of the die is N type silicon.

22. The inverse diode die of claim 19, wherein the P type dopant concentration of the central part of the bottomside P type silicon region is less than $1 \times 10^{16}$ atoms/cm$^3$.

23. The inverse diode die of claim 19, wherein the inverse diode die is a discrete diode device that has a reverse breakdown voltage of at least 1800 volts.

24. The inverse diode die of claim 19, wherein the topside passivation layer is disposed directly on the part of the top semiconductor surface.

25. The inverse diode die of claim 19, wherein the topside passivation layer contacts the topside metal electrode.

26. The inverse diode die of claim 19, wherein the inverse diode die is part of a two-terminal packaged power device.

* * * * *